United States Patent [19]
Kobayashi

[11] Patent Number: 5,264,806
[45] Date of Patent: Nov. 23, 1993

[54] BIPOLAR MICROWAVE MONOLITHIC AMPLIFIER WITH ACTIVE FEEDBACK

[75] Inventor: Kevin W. Kobayashi, Torrance, Calif.

[73] Assignee: TRW Inc., Redondo Beach, Calif.

[21] Appl. No.: 891,970

[22] Filed: May 26, 1992

[51] Int. Cl.$^5$ ............................................. H03F 1/34
[52] U.S. Cl. ...................................... 330/294; 330/85
[58] Field of Search ............... 330/85, 109, 112, 286, 330/291, 294, 310

[56] References Cited

U.S. PATENT DOCUMENTS

| | | | |
|---|---|---|---|
| 3,571,625 | 3/1971 | Braun | 330/291 X |
| 3,624,532 | 11/1971 | Seidel | 330/291 X |
| 4,236,119 | 11/1980 | Battjes | 330/288 |
| 4,774,478 | 9/1988 | Taylor | 330/294 |
| 4,792,987 | 12/1988 | Tumeo | 330/85 X |
| 5,166,639 | 11/1992 | Green et al. | 330/294 |

OTHER PUBLICATIONS

John Chroma, "Simplified Design Guidlines for Dominant Pole Amplfiers Peaked Actively by Emitter or Source Followers" IEEE Transactions on Circuits and Systems, vol. 36, No. 7, Jul. 1989.

*Primary Examiner*—Steven Mottola
*Attorney, Agent, or Firm*—Ronald L. Taylor

[57] ABSTRACT

A bipolar transistor is used as an active feedback inductor to emulate the frequency dependant impedance characteristics of a spiral inductor at microwave frequencies using active techniques. The active feedback is biased by several resistors. By substituting active feedback for a conventional spiral inductor, the chip layout can be reduced by as much as 50%. The bandwidth of the device can be controlled by choosing appropriate tuning resistor values to bias the active feedback inductor when fabricating the chip. By changing the value of these tuning resistors the inductance created can be directly controlled, which in turn affects the frequency response of the device.

10 Claims, 3 Drawing Sheets

BIPOLAR MICROWAVE MONOLITHIC AMPLIFIER WITH ACTIVE FEEDBACK

BACKGROUND OF THE INVENTION

1. Technical Field

The present invention relates to amplifiers in general, and more particularly to a bipolar microwave monolithic wide band amplifier.

2. Discussion

Maturing silicon bipolar and Gallium Arsenide (GaAs) Hetero-Junction Bipolar Technologies have made microwave monolithic integrated circuits (MMIC) common place. A common goal for any monolithic circuit is to use design and fabrication techniques to reduce chip size, increase ease of implementation, and reduce costs in high volume production. These design and fabrication techniques should not compromise performance, and if possible, should improve performance. Conventional microwave feedback designs use a series inductance in a feedback loop of an amplifier to enhance the gain bandwidth of the amplifier. For monolithic designs, these inductors are generally implemented with spiral inductors. The fabrication of spiral inductors on a monolithic chip requires careful modeling, a fairly complicated fabrication process, and large surface areas on the Silicon or Gallium Arsenide wafer. These factors are especially important at low frequencies where the inductor values needed are large. It would be advantageous to remove the spiral inductors from the circuit without sacrificing the increased bandwidth provided by them. Despite the long felt need, it does not appear the prior art has proposed a solution to the problem with the simplicity of the present invention.

SUMMARY OF THE INVENTION

In accordance with the teachings of the present invention, a bipolar transistor is used to provide active feedback to an amplifier emulating the frequency dependant impedance characteristics of a spiral inductor at microwave frequencies. In addition, the active feedback circuit provides positive feedback which can be adjusted to broaden the bandwidth of the amplifier. The active feedback circuit is biased by several resistors. By substituting the active feedback for a conventional spiral inductor, the chip layout can be reduced by as much as 50%. This not only saves area on the chip, but simplifies the entire fabrication process. Also, the bandwidth of the device can be electronically controlled by changing a voltage which sets the bias of the active feedback. By changing the quiescent current through the active feedback transistor, the frequency dependant characteristics created can be directly controlled, which in turn affects the frequency response of the device. This method of adjusting the inductance electronically allows post tuning of the circuit after fabrication has been completed. This gives the capability of recovering lost performance due to fabrication process variations.

BRIEF DESCRIPTION OF THE DRAWINGS

The various advantages of the present invention will become apparent to those skilled in the art after studying the specification and by referencing the drawings in which.

DESCRIPTION OF THE PREFERRED EMBODIMENTS

It should be understood from the onset that the present invention will be described in connection with a few limited examples which illustrate the best mode of practicing the invention at the time this application was filed. However, various modifications will become apparent to those skilled in the art after having the benefit of studying the text, drawings and claims which follow this detailed specification. With that in mind, the attention of the read should now be turned to the drawings, especially FIG. 1.

Figure 1:
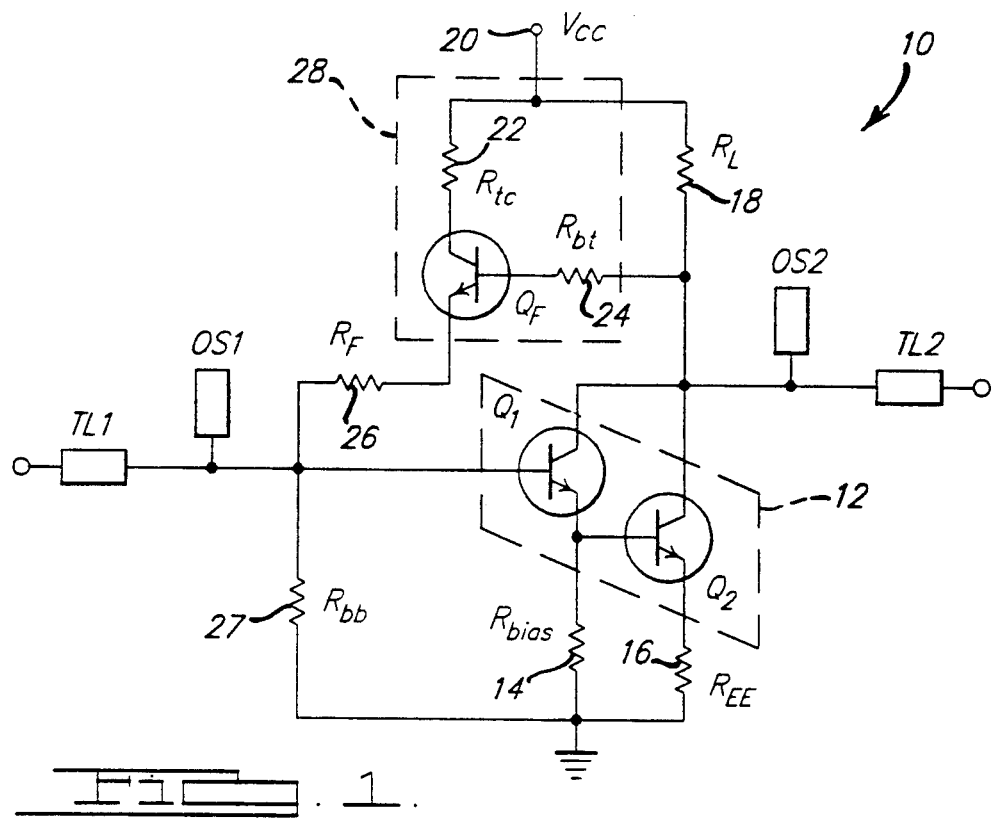
FIG. 1 is a circuit diagram of the preferred embodiment of this invention.

FIG. 1 illustrates a circuit 10 embodying this invention. In accordance with the preferred teachings of this invention, a Darlington transistor pair, comprised of transistors Q1 and Q2, is used as a wide band amplifier 12 for purposes of example. The Darlington amplifier 12 is used since it already has wide bandwidth characteristics. However, any transistor amplifier could be used. Current flow through resistor R-bias 14 establishes a current source that biases transistor Q1. Resistor RL 18 is a biasing resistor as well as an AC load for the Darlington amplifier 12. Resistor Rtc 22 and resistor Rbt 24 tune the frequency dependant impedance of the active feedback circuit 28. Resistors RF 26 and REE 16 are parallel and series feedback resistors, respectively, for setting the nominal gain. Transistor QF along with resistors 22 and 24 comprise the active feedback circuit 28. Current flow through resistor Rbb establishes a current source which biases the active feedback circuit 28. The microstrip or co-planar matching networks OS1, OS2, TL1 & TL2 are tuning elements used for impedance matching of the input and output of the amplifier 10 for optimal performance.

Figure 2:
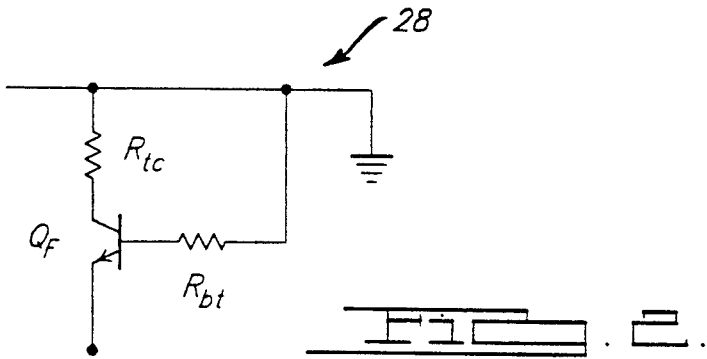
FIG. 2 is an isolated view of the active feedback circuitry.

FIG. 2 illustrates an enlarged view of the active feedback circuit 28. The impedance looking into the emitter of transistor QF looks inductive (i.e., the impedance increases with frequency). At microwave frequencies (i.e. above 1 GHZ) the transistor QF has enough inductance to be a successful substitute for a spiral inductor.

Figure 3:
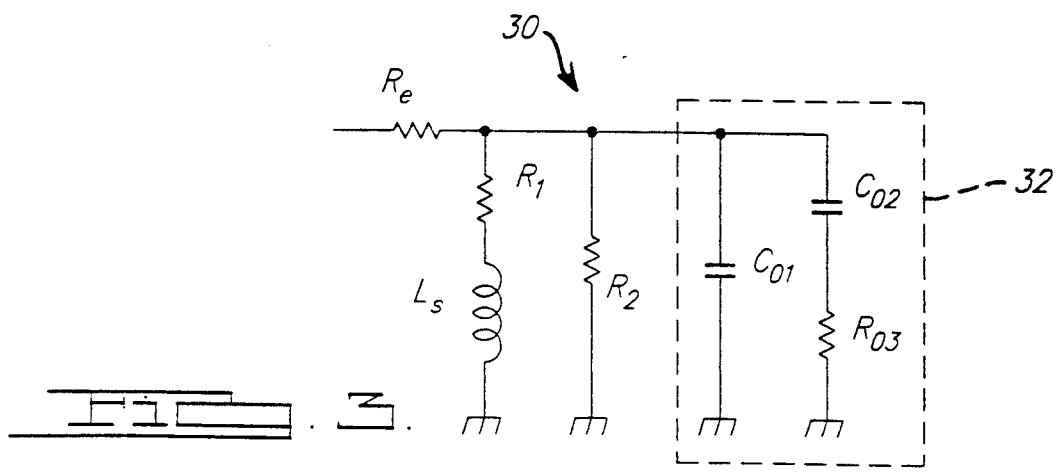
FIG. 3 is an equivalent circuit model of the active feedback circuit incorporating the collector base capacitance of QF.

FIG. 3 illustrates a model 30 incorporating the collector base capacitance of transistor QF. Functional block 32 represents a modification to the classic textbook model of a transistor. This additional circuitry is necessary when modeling transistor characteristics in the microwave range. This new model allows accurate simulations to be generated up to the cutoff frequency of the transistor QF. The following equations develop the parameters indicated in FIG. 3.

$$\beta(\omega) = \frac{\beta_0}{[1 + f/(f_T/\beta_0)]}$$

Where $\beta_0$ is the low frequency beta and $f_t$ is the cutoff frequency of the device.

$$gm_0 = \frac{Ic}{Vt}$$

Where Ic is the collector current and Vt is the physical constant defined as "Kt/q".

$$C\pi = gm_0 \cdot \tau_f + Cbe$$

Where Cbe is the base-emitter depletion capacitance and $\tau_f$ is the forward transistor time.

$$r\pi = \beta_0/gm_0$$

Capacitances values $C_1$ and $C_2$ are defined by the equations:

$$C_1 = Xcjc \cdot C_{bc}$$

$$C_2 = (1 - Xcjc) \cdot C_{bc}$$

Where $C_{bc}$ is the base-collector capacitance and Xcjc is the partitioning factor.

$$\tau = \frac{\pi P_{tf} \cdot \tau_f}{180°}$$

where $P_{tf}$ is the excess phase factor.

Equation (8) thru equation (13) defines the values of the active feedback shown in FIG. 3 as follows:

$$R_2 = Rb + R_{tbeff} \quad (8)$$

Where $R_{tbeff}$ is the effective tuning resistance and Rb is the base resistance of the device.

$$L_s = \frac{1 \times 10^9 [gm_0 \cdot T_f \cdot 1 \times 10^{-12} + C_{be} \cdot 1 \times 10^{-12}]}{R_2/gm_0} nH \quad (9)$$

$$R_1 = 1/gm_0 + R_2/\beta(\omega) \; \Omega \quad (10)$$

Capacitor $Co_1$ is defined as:

$$Co_1 = Cbc \; pF \quad (11)$$

where $C_{bc}$ is the total collector-base capacitance.

Furthermore capacitor $Co_2$ is defined as:

$$Co_2 = Cbc \cdot \beta(\Omega) \; pF \quad (12)$$

Finally, resistor $Ro_3$ is defined by equation 13 as:

$$Ro_3 = \frac{1 \times 10^9 [(gm_0 \cdot T_f \cdot 1 \times 10^{-12}) + Cbe \cdot 1 \times 10^{-12}]}{gm_0 \cdot Cbc} \; \Omega \quad (13)$$

The frequency dependent impedance characteristics of transistor QF help to increase the bandwidth of the amplifier. It is economical to use transistor QF in an active feedback configuration since current fabrication techniques allow production of transistors that are both small and fast. While the amount of the improved bandwidth performance realized may be as much as 20%, it should be appreciated that this additional bandwidth performance is accomplished while reducing the overall size of the chip required by the fabrication process. Several etching and lithography steps are eliminated. Therefore, the overall cost of the chip is reduced, while maintaining a high yield and improved performance.

The active feedback circuit 28 not only provides a frequency dependant impedance, but a positive feedback path. This positive feedback increases as the frequency increases. The phase angle of the impedance increases until the cutoff frequency of the transistor QF is reached. When the cutoff frequency of transistor QF is reached, the amplifier goes into an unstable mode. Therefore, it is important to properly tune the active feedback for the appropriate application.

Figure 4:
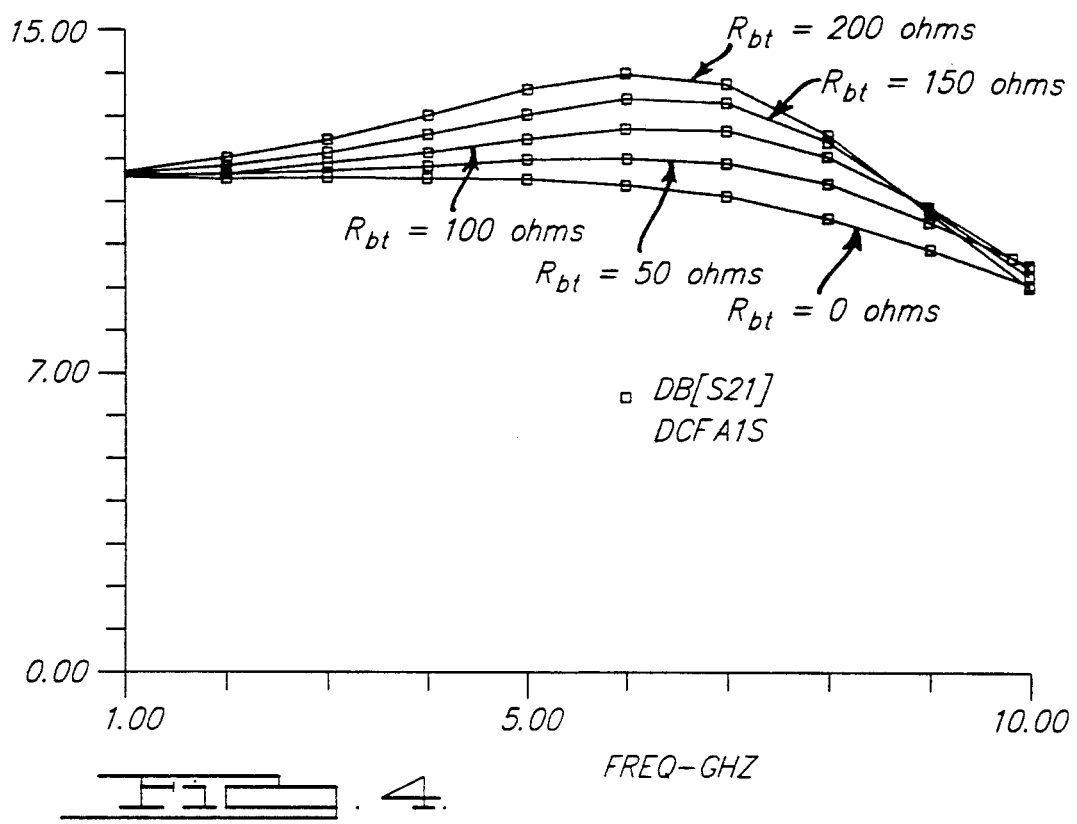
FIG. 4 is a frequency response diagram graphically illustrating how changing the values of the tuning resistors affects the frequency response of the amplifier.
Figure 5:
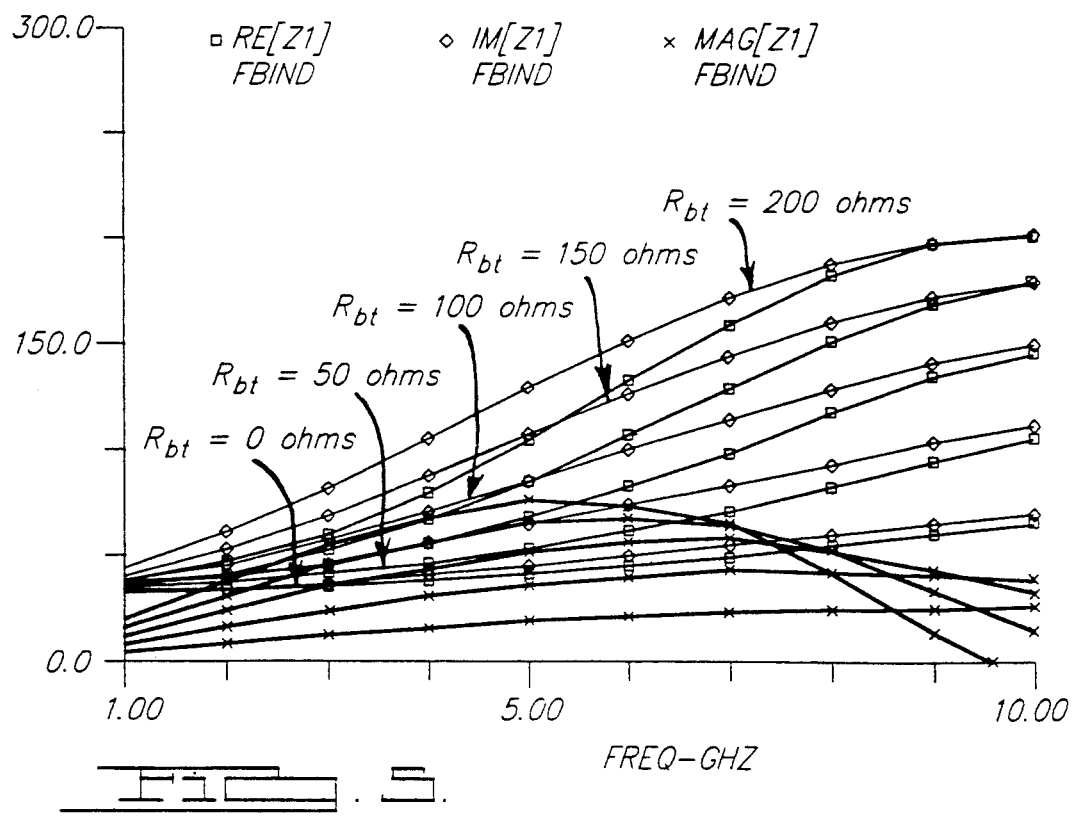
FIG. 5 is a frequency response diagram graphically illustrating the impedance characteristics of the active feedback as a function of resistor value Rbt.

FIG. 4 shows the simulated amplifier gain performance with different values of resistor Rbt 26. In addition to extending the frequency bandwidth of the Darlington amplifier 12 by 20%, a gain peak of 3 dB can be achieved by implementing the active feedback circuit 28. The higher the value of resistor Rbt 26, the higher the frequency dependant impedance. The plot in FIG. 2 shows values of Rbt 26 ranging from 0 ohms to 200 ohms in increments of 50 ohms. FIG. 5 shows the frequency dependant impedance characteristics of the active feedback circuit 28 as a function of Rbt 26. The value of resistor Rtc 20 also influences the magnitude of the frequency dependant impedance, and tends to reduce the quality factor of the active feedback. Additionally, the useful frequency range of active feedback is also determined by the cut off frequency of the bipolar devices and the value of the tuning resistors. Once the desired frequency range and bandwidth of the amplifier are determined, the tuning resistors 22 and 24 of the active feedback circuit 28 can be fabricated accordingly. However, it should be noted that since these values are predetermined prior to fabrication of the device, excessive error in fabrication may result in a device that is out of the desired tolerance range. One way to allow post tuning of the active feedback is to replace tuning resistors Rtc 22 and Rbt 24 with an FET device configured as a variable resistor. This would require tuning of both resistors independently. However, the second embodiment of the present invention should provide a more elegant solution to the tuning problem.

Figure 6:
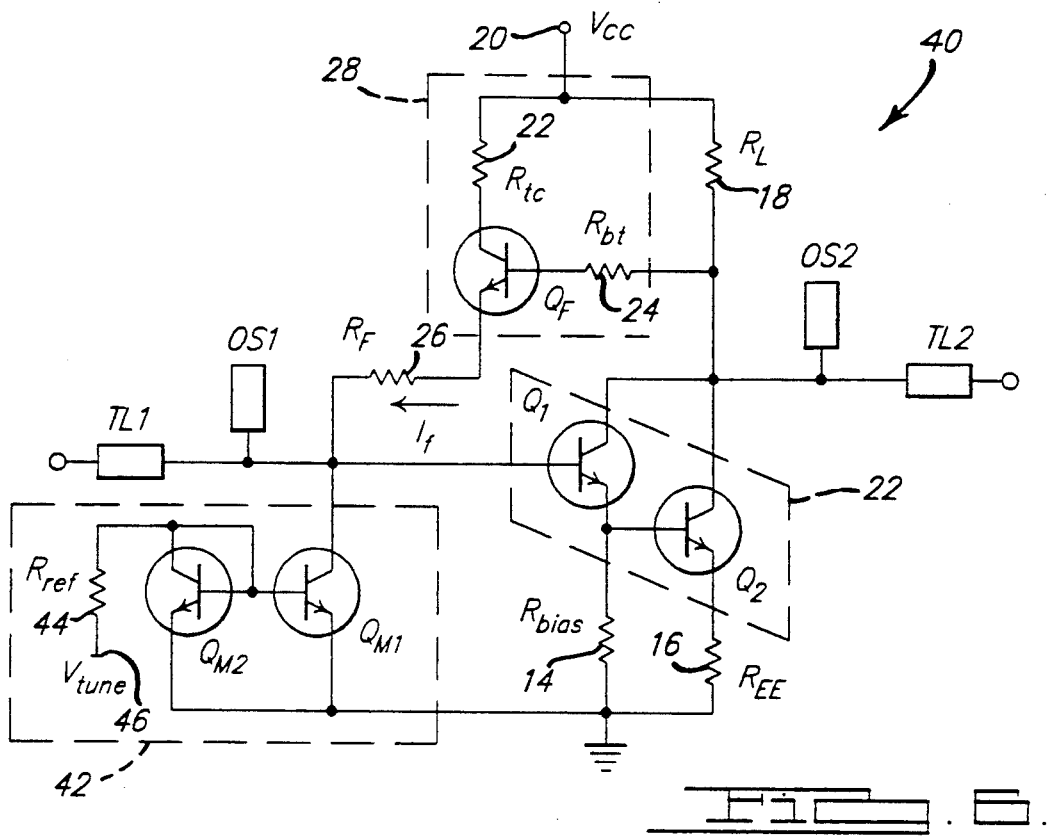
FIG. 6 is a circuit diagram of a second embodiment of the invention showing the addition of two tuning transistors and a tuning resistor.

FIG. 6 illustrates a somewhat more sophisticated embodiment where the active feedback circuit 28 may be tuned through an externally applied voltage Vtune. This gives the chip flexibility to correct the gain response after the amplifier has been fabricated. Resistor Rbb has been replaced by a voltage controlled current source 42. Voltage controlled current source 42 is made up of resistor Rref, and transistors QM1 and QM2. The circuit 42 may be electronically tuned by changing the voltage Vtune. By changing the tuning voltage, the bias current If flowing through the active feedback circuit 28 changes, effectively changing its impedance characteristics.

As in FIG. 1, this active feedback technique has been implemented using a wide band Darlington amplifier 22. Again, it should be noted that any transistor amplifier could be used with this active feedback technique since the invention should increase the bandwidth of any transistor amplifier.

Figure 7:
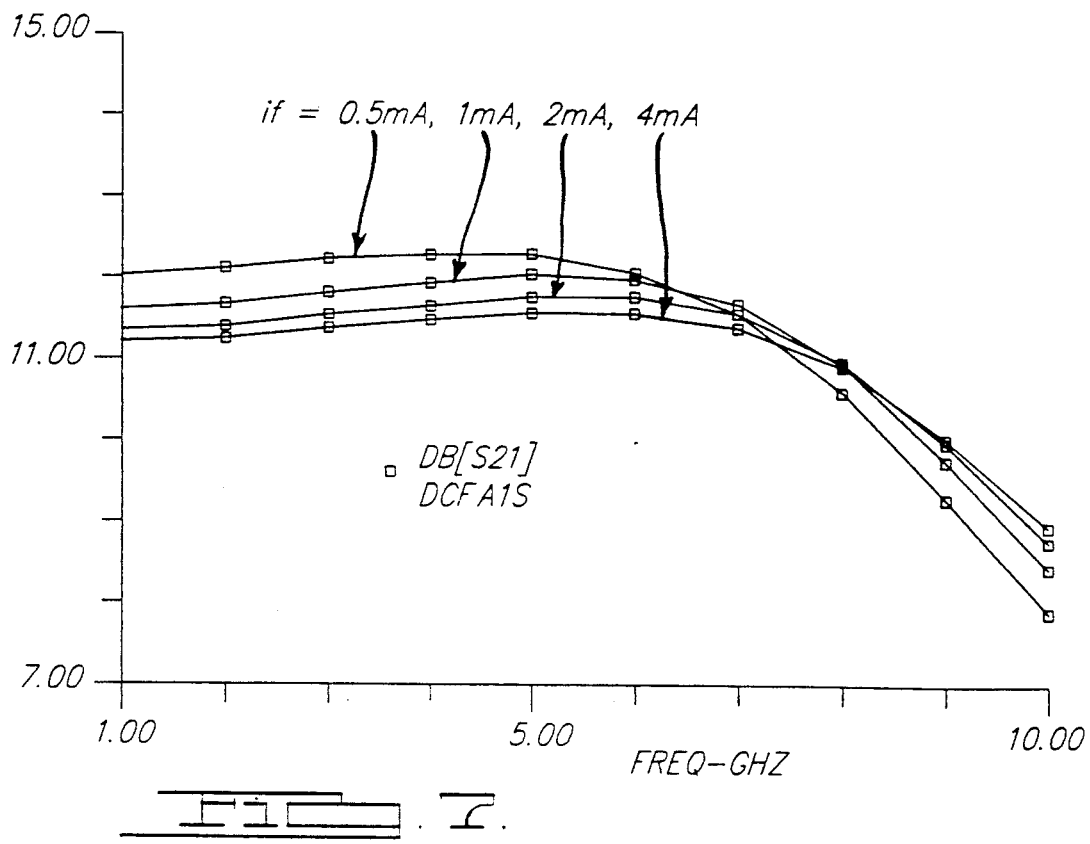
FIG. 7 is a frequency response diagram graphically illustrating how changing the value of the tuning voltage affects the frequency.

FIG. 7 shows the simulated amplifier gain performance for different currents, If, flowing through the active feedback circuit 28. FIG. 7 shows that the gain flatness can be tuned by changing the voltage Vtune which controls the amount of current flowing through the active load. The gain response can be changed by about 1 dB over a current range from 0.5 mA to 4 mA or a 1 dB bandwidth increase of about 13%.

The voltage controlled current source 42 allows approximately a 1 dB gain in tuning range. This tuning variation is wide enough to cover process variations. It should be appreciated that the chip may be tuned to meet gain or bandwidth specifications after the fabrication process has been completed by simply adjusting the tuning voltage Vtune. This design technique can be implemented for high volume commercial production as a low cost general purpose microwave wide band amplifier. As many as 6,000 circuits may fit in a three inch wafer with an expected yield of greater than 90%.

The present invention can also be used in high performance multi-functional monolithic chips. The present technique is especially useful in these multi-functional chips since they rely on a high yield of its components during fabrication. Since all the components are monolithically integrated, the chip performance and yield is limited by that of its individual components. The most used function in a multi-functional design is a gain block which may be used several times throughout the chip. An up converter and a down converter would contain a mixer circuit proceeded by amplifiers in each of the input ports as well as at the output port. The Darlington amplifier with tunable active feedback is a promising candidate for this type of application. This tunable active feedback technique can be used to enhance the performance of other feedback topologies without having to further complicate the fabrication process.

The various advantages of the present invention will become apparent to one skilled in the art after a study of the foregoing specification and following claims.

What is claimed is:

1. A wide band microwave amplifier comprising:
   a first transistor including an input and an output;
   feedback means including a second bipolar transistor coupled to said first transistor for generating frequency dependant impedance characteristics at microwave frequencies by providing active feedback to said first transistor;
   a first resistor in series with a base of the second bipolar transistor and coupled to the output of said first transistor; and
   a second resistor in series with an emitter of the second bipolar transistor and coupled to the input of the first transistor.

2. The amplifier of claim 1 whereby the frequency dependant impedance characteristics are determined by the values of said first and second resistors.

3. The amplifier of claim 2, wherein said first transistor, second transistor, first resistor and second resistor are fabricated using GaAs heterojunction bi-polar technology.

4. A wide band microwave amplifier comprising:
   a first transistor including an input and an output;
   feedback means including a second bipolar transistor coupled to said first transistor for generating frequency dependant impedance characteristics at microwave frequencies by providing active feedback to said first transistor;
   a first resistor in series with a base of the second bipolar transistor and coupled to the output of the first transistor; and
   a second resistor in series with an emitter of the second bipolar transistor and coupled to the input of the first transistor; and
   tuning means for adjusting the frequency dependant impedance characteristics of the feedback means.

5. The amplifier of claim 4, wherein the tuning means further comprises:
   third and fourth parallel coupled transistors in series with the emitter of the second transistor;
   a third resistor coupled to the base of the third and fourth transistors as well as the collector of the third transistor.

6. The circuit of claim 5, wherein the value of the third resistor determines said frequency dependant impedance characteristics of the feedback means.

7. The amplifier of claim 6, wherein said first transistor, second transistor, third transistor, fourth transistor, first resistor, second resistor and third resistor are all fabricated on a single wafer.

8. The amplifier of claim 7, wherein said first transistor second transistor, third transistor, fourth transistor, first resistor, second resistor and third resistor are fabricated using GaAs heterojunction bi-polar technology.

9. A bipolar microwave monolithic amplifier for operating at frequencies exceeding about 1 GHz, said amplifier comprising:
   a Darlington transistor pair in which a collector of each transistor of the transistor pair are connected together; and
   feedback means coupled between the collectors of the Darlington transistor pair and an input to the Darlington transistor pair, said feedback means including a bipolar transistor having a base coupled to the collectors of the Darlington transistor pair through a first tuning resistor, the emitter of the bipolar transistor being coupled to a base of the Darlington pair through a first feedback resistor, with the collector of the bipolar transistor being connected to a second tuning resistor, said feedback means emulating frequency impedance characteristics of a spiral inductor at said frequencies by increasing positive feedback as a frequency at which said Darlington transistor pair operates increases.

10. The amplifier of claim 9 which further comprises:
    voltage controlled current source means coupled to the input of the Darlington pair and to the emitter of the bipolar transistor in the feedback means; and
    a variable voltage source coupled to the voltage controlled current source for adjusting the bandwidth of the amplifier as desired by varying the voltage applied to the voltage control current source.

* * * * *